United States Patent
Poulton

(10) Patent No.: US 7,135,925 B2
(45) Date of Patent: Nov. 14, 2006

(54) ADAPTIVE BIAS SCHEME FOR HIGH-VOLTAGE COMPLIANCE IN SERIAL LINKS

(75) Inventor: John W. Poulton, Chapel Hill, NC (US)

(73) Assignee: Rambus Inc., Los Altos, CA (US)

( * ) Notice: Subject to any disclaimer, the term of this patent is extended or adjusted under 35 U.S.C. 154(b) by 63 days.

(21) Appl. No.: 11/004,343

(22) Filed: Dec. 3, 2004

(65) Prior Publication Data
US 2006/0119430 A1    Jun. 8, 2006

(51) Int. Cl.
   *H03F 3/45* (2006.01)
(52) U.S. Cl. ............... 330/253; 330/311; 330/277
(58) Field of Classification Search ......... 330/253, 330/311, 277
   See application file for complete search history.

(56) References Cited

U.S. PATENT DOCUMENTS

| | | | |
|---|---|---|---|
| 4,964,116 A * | 10/1990 | Measor | 375/229 |
| 6,515,547 B1 * | 2/2003 | Sowlati | 330/311 |
| 6,667,661 B1 * | 12/2003 | Liu et al. | 330/311 |
| 6,744,319 B1 * | 6/2004 | Kim | 330/254 |
| 6,747,514 B1 * | 6/2004 | Aude | 330/253 |

OTHER PUBLICATIONS

Annema, Anne-Johan et al., "Designing Analog Circuits in CMOS." EE Times, Feb. 11, 2004. pp. 1-4.
Calvert, J.B. "Interesting Circuits." Followers and the JFET. Electronics 8. Jul. 16, 2001 (last revised Jul. 18, 2001). 7 pages.
Minch, Bradley A. "A Low-Voltage MOS Cascode Bias Circuit for all Current Levels." Mixed Analog-Digital VLSI Circuits and Systems Lab, Cornell University. May 28, 2002. 34 pgs.

* cited by examiner

*Primary Examiner*—Patricia Nguyen
(74) *Attorney, Agent, or Firm*—Silicon Edge Law Group LLP; Arthur J. Behiel

(57) ABSTRACT

A high-speed serial-link driver transmits a differential data signal to a conventional differential receiver via a differential channel. The driver employs termination voltages that are high, relative to the supply voltage employed by the transmitter core logic, to support communication with legacy devices. Cascode amplifiers using an adaptive biasing scheme allow the driver to include voltage-sensitive, high-performance transistors despite the relatively high termination voltage.

21 Claims, 1 Drawing Sheet

ADAPTIVE BIAS SCHEME FOR HIGH-VOLTAGE COMPLIANCE IN SERIAL LINKS

FIELD OF THE INVENTION

The present invention relates generally to the field of communications, and more particularly to high-speed electronic signaling within and between integrated circuit devices.

BACKGROUND

Integrated circuits fabricated using modern deep submicron processes operate at relatively low supply voltages, but may be required to inter-operate with legacy devices that operate at relatively higher voltages. Unfortunately, the higher voltages of such legacy devices present serious reliability problems for the thin-oxide field-effect transistors (FETs) made available by advanced processes and preferred for high-speed communication. Circuits that support communication at higher voltages in support of legacy devices therefore employ high-voltage-tolerant devices, such as thick-oxide transistors, in place of higher performance devices.

DETAILED DESCRIPTION

Figure 1:
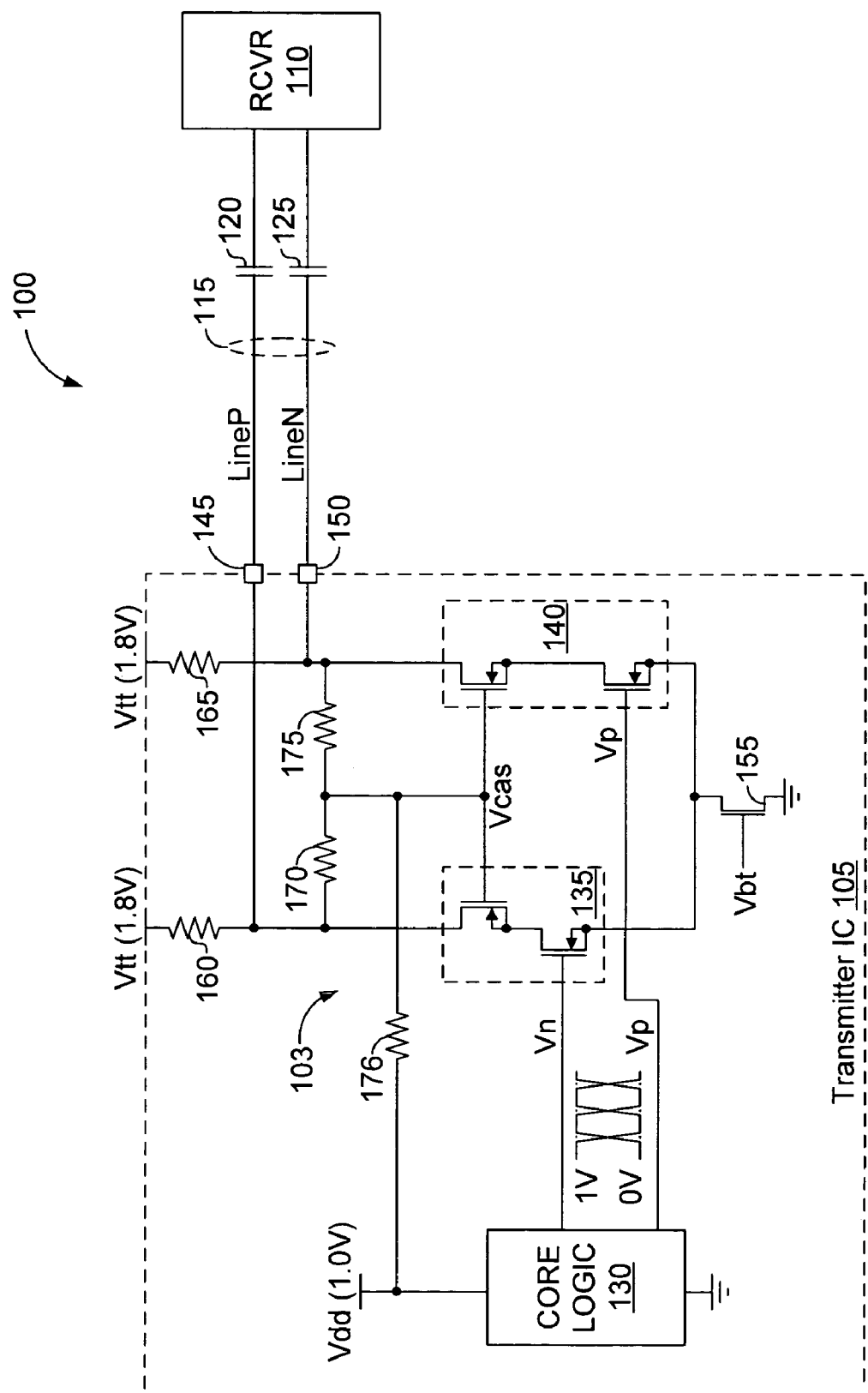
FIG. 1 depicts a high-speed serial communication system 100 in accordance with one embodiment.

FIG. 1 depicts a high-speed serial communication system 100 in accordance with one embodiment. System 100 includes a serial-link driver 103, instantiated on an integrated circuit (IC) 105, that transmits a differential data signal Vp/Vn to a conventional differential receiver 110 as a pair of output signal halves LineP and LineN via a differential channel 115. Driver 103 employs a termination voltage Vtt that is high relative to supply voltage Vdd to support communication with legacy devices. A differential pair of cascode amplifiers 135 and 140 uses an adaptive biasing scheme that allows the driver to include voltage-sensitive, high-performance transistors despite the relatively high termination voltage. Communication system 100 consequently offers considerable performance advantages over schemes that employ voltage-tolerant transistors, such as thick-oxide transistors, for legacy compliance.

Driver 103 is AC coupled to receiver 110 in the depicted example using a pair of capacitors 120 and 125, though the coupling may be direct in other embodiments. Embodiments of receiver 110 and channel 115 are well known in the art, so a detailed discussion of those devices is omitted here for brevity. Likewise, core logic 130 may be any circuitry that develops signals to be conveyed from IC 105 via channel 115, so a detailed treatment of logic 130 is also omitted. Termination voltage Vtt and supply voltage Vdd, sourced between respective power-supply terminals Vtt and Vdd and ground, are 1.8 volts and 1.0 volts, respectively, but embodiments of the invention can be used with other combinations of supply voltages.

Each of cascode amplifiers 135 and 140 includes a respective input terminal coupled to core logic 130 via lines Vn and Vp, a cascode terminal Vcas, a first current-handling terminal coupled to one of a pair of differential output nodes 145 and 150, and a second current-handling terminal coupled to ground potential via a tail transistor 155. The first current-handling terminals of cascode amplifiers 135 and 140 are coupled to termination voltage Vtt via a respective pair of termination elements (loads) 160 and 165. The bias level on cascode terminals Vcas is actively controlled by a pair of resistors 170 and 175 that apply the common-mode voltage across output nodes 145 and 150 to node Vcas, the cascode terminal of both amplifiers 135 and 140. In some embodiments a third resistor 176 may be employed to adjust the Vcas bias voltage toward a voltage reference, such as one of the power-supply nodes. In FIG. 1, the power supply Vdd is used for this purpose. In other embodiments the Vtt power supply may be employed, resistor 176 may be replaced with a resistor network connected to two or more of the power supply terminals, or resistor 176 may be omitted altogether. The active control of the cascode voltage prevents the transistors within cascode amplifiers 135 and 140 from experiencing potentially destructive over-voltage conditions, and thus facilitates the use of more sensitive, higher-performance output transistors.

The operation of driver 103 is similar to that of a conventional differential stage. In essence, driver 103 amplifies the difference between input signals Vn and Vp, providing the amplified result across output nodes 145 and 150. The cascode transistors in amplifiers 135 and 140 provide some voltage gain, albeit at the expense of some added output capacitance. Resistors 170 and 175 should generally be large relative to termination elements 160 and 165, 500 ohms vs. 50 ohms in one embodiment, so that their effect on termination impedance and required output current is negligible.

The widths of the input and cascode transistors can be adjusted to change the output characteristics of driver 103. Increasing the width of the cascode transistors relative to the switching transistors increases the output capacitance of driver 103, which in turn tends to reduce high-frequency performance of the driver. However, increasing the width of the cascode transistors allows the switching transistors of cascode amplifiers 135 and 140 to be drawn smaller, thereby reducing the load on core logic 130 and the power consumed by the core logic in driving signals Vp/Vn. On the other hand, decreasing the width of the cascode transistors relative to the switching transistors reduces output capacitance, improving the high-frequency performance of the driver, but at the expense of higher power consumption in core logic 130. In a typical embodiment, the cascode transistors may be drawn twice as wide as the input transistors, for example, to provide a good compromise between power consumption and high-frequency performance.

Driver 103, despite the use of voltage-sensitive transistors, is relatively insensitive to various fault conditions that might otherwise overstress the output transistors. Types of overstress typically encountered include hot-electron degradation, which may occur when transistors pass high drain current in the presence of high drain-to-bulk voltages, or dielectric breakdown, which may occur when excessive voltage is applied across the gate dielectric. The active cascode bias levels provided by resistors 170 and 175 (and resistor 176, if employed) prevent both types of overstress in a variety of fault conditions.

Fault Condition: Output Shorted to Vtt

One over-voltage condition occurs when one or both of output nodes 145 and 150 is shorted to supply voltage Vtt, as by an errant connection, when the corresponding cascode amplifier is biased on (e.g., when voltage Vn is at or near voltage Vdd). Node 145 might be shorted to supply voltage Vtt when cascode amplifier 135 is biased on, for example. In that instance, resistor 170 pulls node Vcas high enough to turn on both cascode transistors, irrespective of the voltage on node 150 (provided node 150 remains between zero and 1.8 volts). The two transistors of cascode amplifier 135 would therefore both conduct current to ground via tail transistor 155. Because the two transistors are in series, each drops a considerable portion of the voltage between respective terminal element 160 and tail transistor 155. The resistor network that includes resistors 170, 175, and optionally 176 can be optimized so that the transistors of cascode amplifiers 135 and 140 each drop about half of the voltage between respective terminal element 160 and tail transistor 155, and thus equally share the overstress to maintain the drain-to-bulk voltage of each transistor within safe limits. This sharing of the voltage drop prevents hot electron degradation. In some embodiments, the transistors in each cascode amplifier are formed in floating P-wells, which are doped regions on IC 105 that are electrically insulated from supply terminals Vtt and ground. This practice minimizes the drain-to-bulk voltage of each of the transistors in each of cascode amplifiers 135 and 140.

Fault Condition: Output Shorted to Ground

Another over-voltage condition occurs when one of output nodes 145 and 150 is shorted to the lower supply voltage (e.g., ground), as by an errant connection, when the corresponding cascode amplifier is biased on. Node 145 might be shorted to ground when cascode amplifier 135 is biased on, for example. In that instance, resistor 170 pulls node Vcas below one volt irrespective of the voltage on node 150 (again assuming node 150 remains between zero and 1.8 volts). Maintaining a low voltage on cascode terminal Vcas maintains a low enough potential across the gates of the cascode transistors to avoid dielectric breakdown.

Errant connections are not the only manner of shorting nodes 145 to voltages that, without the active cascode biasing provided by transistors 170 and 175, might damage the output transistors. At start-up, for example, capacitors 120 and 125 may be discharged before supply voltage Vtt is available. In that case, capacitors 120 and 125 may appear to driver 103 as shorts to ground for the time interval required to charge them to their final operating voltages. Other fault conditions occur, for example, when channel 115 is disconnected, or when termination supply voltage Vtt is available before core supply voltage Vdd. Driver 103 can be optimized to protect the transistors of amplifiers 135 and 140 under all such conditions.

In the foregoing description and in the accompanying drawings, specific terminology and drawing symbols are set forth to provide a thorough understanding of the present invention. In some instances, the terminology and symbols may imply specific details that are not required to practice the invention. For example, the output of driver 103 can be differential or single ended. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved.

An output of the design process for an integrated circuit, or a portion of an integrated circuit, may be a computer-readable medium (e.g., a magnetic tape or an optical or magnetic disk) encoded with data structures or other information defining circuitry that may be physically instantiated as an integrated circuit or portion of an integrated circuit. These data structures are commonly written in Caltech Intermediate Format (CIF) or GDSII, a proprietary binary format. Those of skill in the art of mask preparation can develop such data structures from schematic diagrams of the type detailed above.

While the present invention has been described in connection with specific embodiments, variations of these embodiments will be obvious to those of ordinary skill in the art. For example:

1. The cascode amplifiers (e.g., 135 and 140) may each consist of a high-performance thin-oxide transistor to handle current switching, controlled by voltages Vp and Vn, in series with a thick-oxide cascode transistor. This arrangement allows even higher Vtt voltages, relative to the maximum allowed Vdd voltage, retaining the fast current switching of the thin-oxide transistors, but at the expense of increased output capacitance.
2. Resistors, such as those depicted in FIG. 1, can be formed using any of a number of structures that limit current flow using e.g. isolated sections of a wafer surface, doped regions, deposited thin films. Indeed, resistors are often formed based upon transistor structures. The term "resistor," as used herein, should therefore be interpreted broadly as a circuit element that resists current to develop a voltage.

Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. Section 112.

What is claimed is:

1. A circuit comprising:
   a. first and second power-supply terminals;
   b. first and second cascode amplifiers, each cascode amplifier including an input terminal, a cascode terminal, a first current-handling terminal, and a second current-handling terminal;
   c. a first load coupled between the first current-handling terminal of the first cascode amplifier and the first power-supply terminal;
   d. a second load coupled between the first current-handling terminal of the second cascode amplifier and the first power-supply terminal;
   e. a first resistor coupled between the first current-handling terminal of the first cascode amplifier and the cascode terminals of the first and second cascode amplifiers; and
   f. a second resistor coupled between the first current-handling terminal of the second cascode amplifier and the cascode terminals of the first and second cascode amplifiers;
   g. wherein each of the first and second cascode amplifiers includes a plurality of transistors formed in common wells, and wherein the wells are electrically insulated from the first and second power-supply terminals.

2. The circuit of claim 1, further comprising a tail transistor, wherein the second current-handling terminals of the first and second cascode amplifiers are coupled to the second power-supply terminal via the tail transistor.

3. The circuit of claim 1, wherein each of the first and second cascode amplifiers includes first and second transistors.

4. The circuit of claim 3, wherein the first and second transistors in the first cascode amplifier are coupled in series between the first and second current-handling terminals of the first cascode amplifier and the first and second transistors in the second cascode amplifier are coupled in series between the first and second current-handling terminals of the second cascode amplifier.

5. The circuit of claim 4, wherein the first transistor in the first cascode amplifier includes a first control terminal coupled to the input terminal of the first cascode amplifier, the first transistor in the second cascode amplifier includes a second control terminal coupled to the input terminal of the second cascode amplifier, the second transistor in the first cascode amplifier includes a third control terminal coupled to the cascode terminal of the first cascode amplifier, and the second transistor in the second cascode amplifier includes a fourth control terminal coupled to the cascode terminal of the second cascode amplifier.

6. The circuit of claim 1, wherein each of the first and second cascode amplifiers includes a plurality of transistors, each transistor having a similar gate-dielectric thickness.

7. A circuit comprising:
   a. first and second power-supply terminals;
   b. first and second cascode amplifiers, each cascode amplifier including an input terminal, a cascode terminal, a first current-handling terminal, and a second current-handling terminal;
   c. a first load coupled between the first current-handling terminal of the first cascode amplifier and the first power-supply terminal;
   d. a second load coupled between the first current-handling terminal of the second cascode amplifier and the first power-supply terminal;
   e. a first resistor coupled between the first current-handling terminal of the first cascode amplifier and the cascode terminals of the first and second cascode amplifiers; and
   f. a second resistor coupled between the first current-handling terminal of the second cascode amplifier and the cascode terminals of the first and second cascode amplifiers;
   g. wherein the first and second resistors exhibit resistances substantially higher than the first and second loads.

8. A circuit comprising:
   a. first and second power-supply terminals;
   b. first and second cascode amplifiers, each cascode amplifier including an input terminal, a cascode terminal, a first current-handling terminal, and a second current-handling terminal;
   c. a first load coupled between the first current-handling terminal of the first cascode amplifier and the first power-supply terminal;
   d. a second load coupled between the first current-handling terminal of the second cascode amplifier and the first power-supply terminal;
   e. a first resistor coupled between the first current-handling terminal of the first cascode amplifier and the cascode terminals of the first and second cascode amplifiers; and
   f. a second resistor coupled between the first current-handling terminal of the second cascode amplifier and the cascode terminals of the first and second cascode amplifiers;
   g. wherein the first and second power-supply terminals receive between them a supply voltage of a supply amplitude, and wherein the first and second cascode amplifiers receive a differential input signal having a differential amplitude substantially less then the supply amplitude.

9. The circuit of claim 8, wherein the differential amplitude is less than two-thirds the supply amplitude.

10. A circuit comprising:
    a. first and second power-supply terminals;
    b. first and second cascode amplifiers, each cascode amplifier including an input terminal, a cascode terminal, a first current-handling terminal, and a second current-handling terminal;
    c. a first load coupled between the first current-handling terminal of the first cascode amplifier and the first power-supply terminal;
    d. a second load coupled between the first current-handling terminal of the second cascode amplifier and the first power-supply terminal;
    e. a first resistor coupled between the first current-handling terminal of the first cascode amplifier and the cascode terminals of the first and second cascode amplifiers;
    f. a second resistor coupled between the first current-handling terminal of the second cascode amplifier and the cascode terminals of the first and second cascode amplifiers; and
    g. a reference terminal and a third resistor coupled between the cascode terminal and the reference terminal.

11. The circuit of claim 10, wherein the reference terminal is a third power-supply terminal.

12. The circuit of claim 1, wherein each of the first and second cascode amplifiers consists essentially of two transistors, including a first transistor having a first gate dielectric and a second transistor having a second gate dielectric thicker than the first gate dielectric.

13. A communication system comprising:
    a. a transmitter having:
       i. a first supply terminal to provide a termination voltage;
       ii. a second supply terminal to provide a second voltage;
       iii. first and second cascode amplifiers, each cascode amplifier including an input terminal, a cascode terminal, a first current-handling terminal, and a second current-handling terminal;
       iv. a first termination element coupled between the first current-handling terminal of the first cascode amplifier and the first supply terminal;
       v. a second termination element coupled between the first current-handling terminal of the second cascode amplifier and the first supply terminal;
       vi. a first resistor coupled between the first current-handling terminal of the first cascode amplifier and the cascode terminals of the first and second cascode amplifiers; and
       vii. a second resistor coupled between the first current-handling terminal of the second cascode amplifier and the cascode terminals of the first and second cascode amplifiers;

b. a communication channel coupled to first supply terminal via the first and second termination elements; and c. a receiver coupled to the communication channel;

d. wherein the transmitter further has a third supply terminal providing a third supply voltage lower than the first supply voltage.

14. The communication system of claim 13, wherein the transmitter further has core logic whose power supply is coupled to the third supply terminal.

15. The communication system of claim 13, wherein each of the first and second cascode amplifiers consists essentially of two transistors.

16. The communication system of claim 13, wherein each of the first and second cascode amplifiers includes a plurality of transistors, each transistor having a similar gate-dielectric thickness.

17. A communication system comprising:

a. a transmitter having:

i. a first supply terminal to provide a termination voltage;

ii. a second supply terminal to provide a second voltage;

iii. first and second cascode amplifiers, each cascode amplifier including an input terminal, a cascode terminal, a first current-handling terminal, and a second current-handling terminal;

iv. a first termination element coupled between the first current-handling terminal of the first cascode amplifier and the first supply terminal;

v. a second termination element coupled between the first current-handling terminal of the second cascode amplifier and the first supply terminal;

vi. a first resistor coupled between the first current-handling terminal of the first cascode amplifier and the cascode terminals of the first and second cascode amplifiers; and vii. a second resistor coupled between the first current-handling terminal of the second cascode amplifier and the cascode terminals of the first and second cascode amplifiers;

b. a communication channel coupled to first supply terminal via the first and second termination elements; and c. a receiver coupled to the communication channel;

d. wherein the first and second resistors exhibit resistances substantially higher than the first and second loads.

18. A communication system comprising;

a. a transmitter having:

i. a first supply terminal to provide a termination voltage;

ii. a second supply terminal to provide a second voltage;

iii. first and second cascode amplifiers, each cascode amplifier including an input terminal, a cascode terminal, a first current-handling terminal, and a second current-handling terminal;

iv. a first termination element coupled between the first current-handling terminal of the first cascode amplifier and the first supply terminal;

v. a second termination element coupled between the first current-handling terminal of the second cascode amplifier and the first supply terminal;

vi. a first resistor coupled between the first current-handling terminal of the first cascode amplifier and the cascode terminals of the first and second cascode amplifiers; and vii. a second resistor coupled between the first current-handling terminal of the second cascode amplifier and the cascode terminals of the first and second cascode amplifiers;

b. a communication channel coupled to first supply terminal via the first and second termination elements; and c. a receiver coupled to the communication channel;

d. a reference terminal and a third resistor coupled between the cascode terminal and the reference terminal.

19. The communication system of claim 18, wherein the reference terminal is a third power-supply terminal.

20. A computer-readable medium having stored thereon a data structure defining a differential driver, the data structure comprising:

a. first data representing a first supply terminal to provide a termination voltage and a second supply terminal to provide a second voltage;

b. second data representing first and second cascode amplifiers, each cascode amplifier including an input terminal, a cascode terminal, a first current-handling terminal, and a second current-handling terminal;

c. third data representing a first termination element coupled between the first current-handling terminal of the first cascode amplifier and the first supply terminal, and a second termination element coupled between the first current-handling terminal of the second cascode amplifier and the first supply terminal; and d. fourth data representing a first resistor coupled between the first current-handling terminal of the first cascode amplifier and the cascode terminals of the first and second cascode amplifiers, and a second resistor coupled between the first current-handling terminal of the second cascode amplifier and the cascode terminals of the first and second cascode amplifiers;

e. wherein the data structure further comprises fifth data representing a reference terminal and a third resistor coupled between the cascode terminal and the reference terminal.

21. The computer-readable medium of claim 20, wherein the reference terminal is a third power-supply terminal.

* * * * *